(12) United States Patent
Chen et al.

(10) Patent No.: US 10,349,742 B2
(45) Date of Patent: Jul. 16, 2019

(54) SLIDE RAIL ASSEMBLY AND SLIDE RAIL MECHANISM THEREOF

(71) Applicants: King Slide Works Co, Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Yao-Tsung Chen, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 15/921,837

(22) Filed: Mar. 15, 2018

(65) Prior Publication Data
US 2019/0059585 A1 Feb. 28, 2019

(30) Foreign Application Priority Data
Aug. 31, 2017 (TW) .............................. 106130066 A

(51) Int. Cl.
| | |
|---|---|
| *A47B 88/43* | (2017.01) |
| *A47B 57/38* | (2006.01) |
| *A47B 96/07* | (2006.01) |
| *H05K 7/14* | (2006.01) |
| *H05K 7/18* | (2006.01) |
| *A47B 88/40* | (2017.01) |

(Continued)

(52) U.S. Cl.
CPC .............. *A47B 88/43* (2017.01); *A47B 57/38* (2013.01); *A47B 88/407* (2017.01); *A47B 88/427* (2017.01); *A47B 96/06* (2013.01); *A47B 96/07* (2013.01); *H02B 1/36* (2013.01); *H05K 7/1489* (2013.01); *H05K 7/183* (2013.01); *A47B 57/34* (2013.01); *A47B 2088/4278* (2017.01); *E05C 3/14* (2013.01); *F16M 13/022* (2013.01)

(58) Field of Classification Search
CPC ..... A47B 88/43; A47B 88/044; A47B 88/427; A47B 88/0422; A47B 88/423; A47B 88/0418; A47B 88/473; A47B 88/477; A47B 88/40; A47B 2210/0016; A47B 2210/0018; H02B 1/36; H05K 7/1489; H05K 7/183
See application file for complete search history.

(56) References Cited

U.S. PATENT DOCUMENTS

| | | | |
|---|---|---|---|
| 5,431,381 A | 7/1995 | Smed | |
| 6,854,817 B1 * | 2/2005 | Simon | ................. A47B 88/493 312/334.6 |

(Continued)

FOREIGN PATENT DOCUMENTS

CN 104433358 A 3/2015

*Primary Examiner* — Andrew M Roersma
(74) *Attorney, Agent, or Firm* — Alan D. Kamrath; Mayer & Williams PC

(57) ABSTRACT

A slide rail mechanism includes a slide rail and a reinforcing structure. The slide rail includes a first section and a second section. The second section is bent relative to the first section. The reinforcing structure is arranged at the slide rail. The reinforcing structure includes a first part and a second part. The second part is bent relative to the first part. The first part and the second part are respectively attached to the first section and the second section.

15 Claims, 7 Drawing Sheets

(51) Int. Cl.
*A47B 88/42* (2017.01)
*A47B 96/06* (2006.01)
*H02B 1/36* (2006.01)
*A47B 57/34* (2006.01)
*E05C 3/14* (2006.01)
*F16M 13/02* (2006.01)
*A47B 88/407* (2017.01)
*A47B 88/427* (2017.01)

(56) References Cited

U.S. PATENT DOCUMENTS

| | | |
|---|---|---|
| 6,883,884 B2 | 4/2005 | Chen et al. |
| 8,274,251 B2 | 9/2012 | Yoo et al. |
| 8,303,052 B2 | 11/2012 | Chen et al. |
| 9,370,120 B2 | 6/2016 | Chen et al. |
| 9,554,648 B2 | 1/2017 | Hernandez Zaragoza |
| 9,867,462 B2 | 1/2018 | Chen et al. |
| 2006/0152115 A1* | 7/2006 | Dubon ............. H05K 7/1489 312/334.8 |
| 2008/0122333 A1 | 5/2008 | Tseng et al. |
| 2009/0294393 A1 | 12/2009 | Chen et al. |
| 2012/0080395 A1* | 4/2012 | Chen ............. H05K 7/1489 211/184 |
| 2012/0145856 A1* | 6/2012 | Reidt ............. F24C 15/168 248/226.11 |
| 2012/0153104 A1* | 6/2012 | Yu ............. H05K 7/1489 248/218.4 |
| 2014/0217049 A1* | 8/2014 | Chen ............. H05K 7/1489 211/195 |
| 2014/0265786 A1* | 9/2014 | Chen ............. H05K 7/1489 312/334.1 |
| 2015/0002008 A1* | 1/2015 | Domenig ............. B21D 35/001 312/334.8 |
| 2017/0303426 A1* | 10/2017 | Chen ............. A47B 96/07 |
| 2018/0172071 A1 | 6/2018 | Kuribayashi |

* cited by examiner

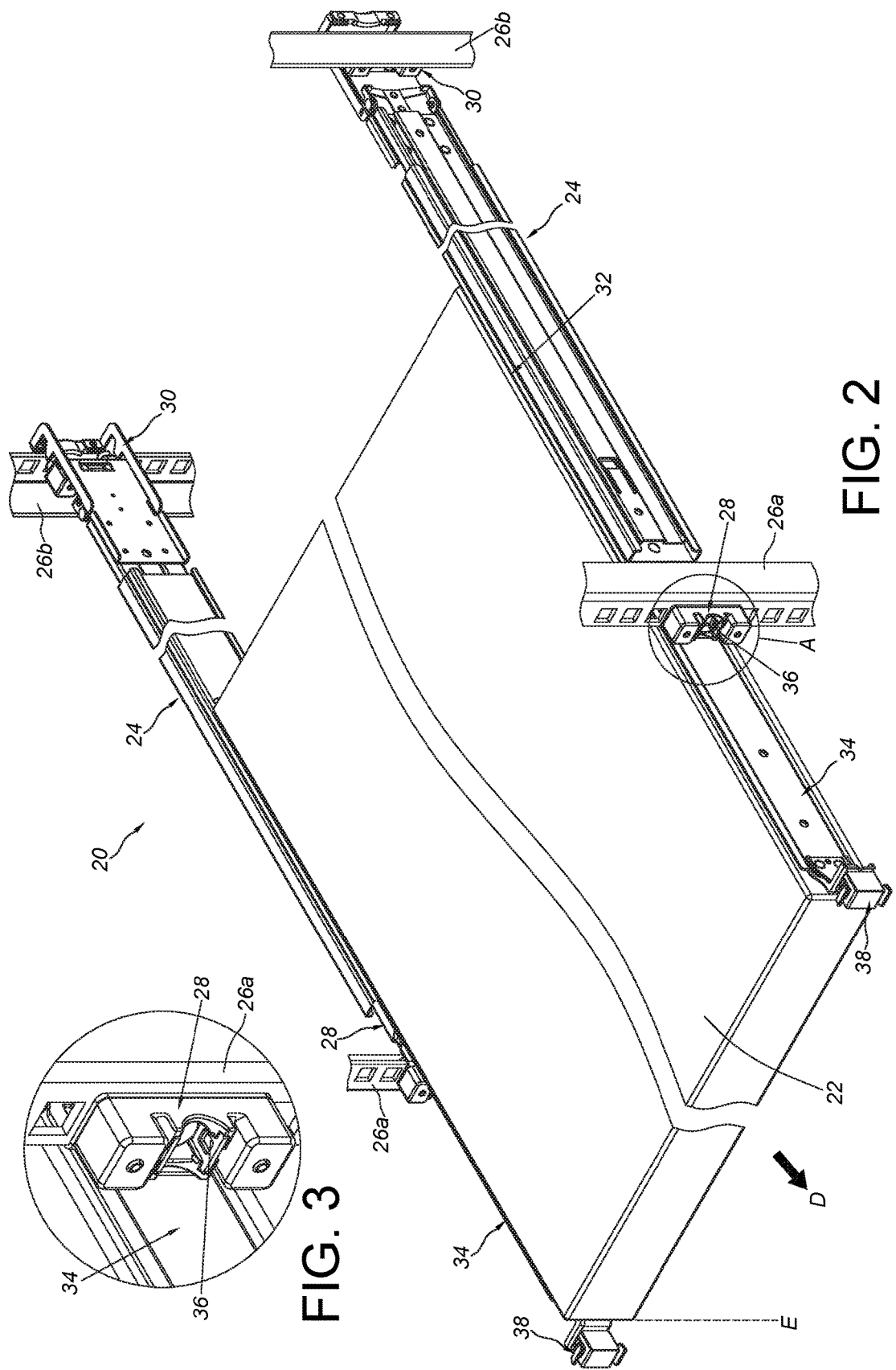

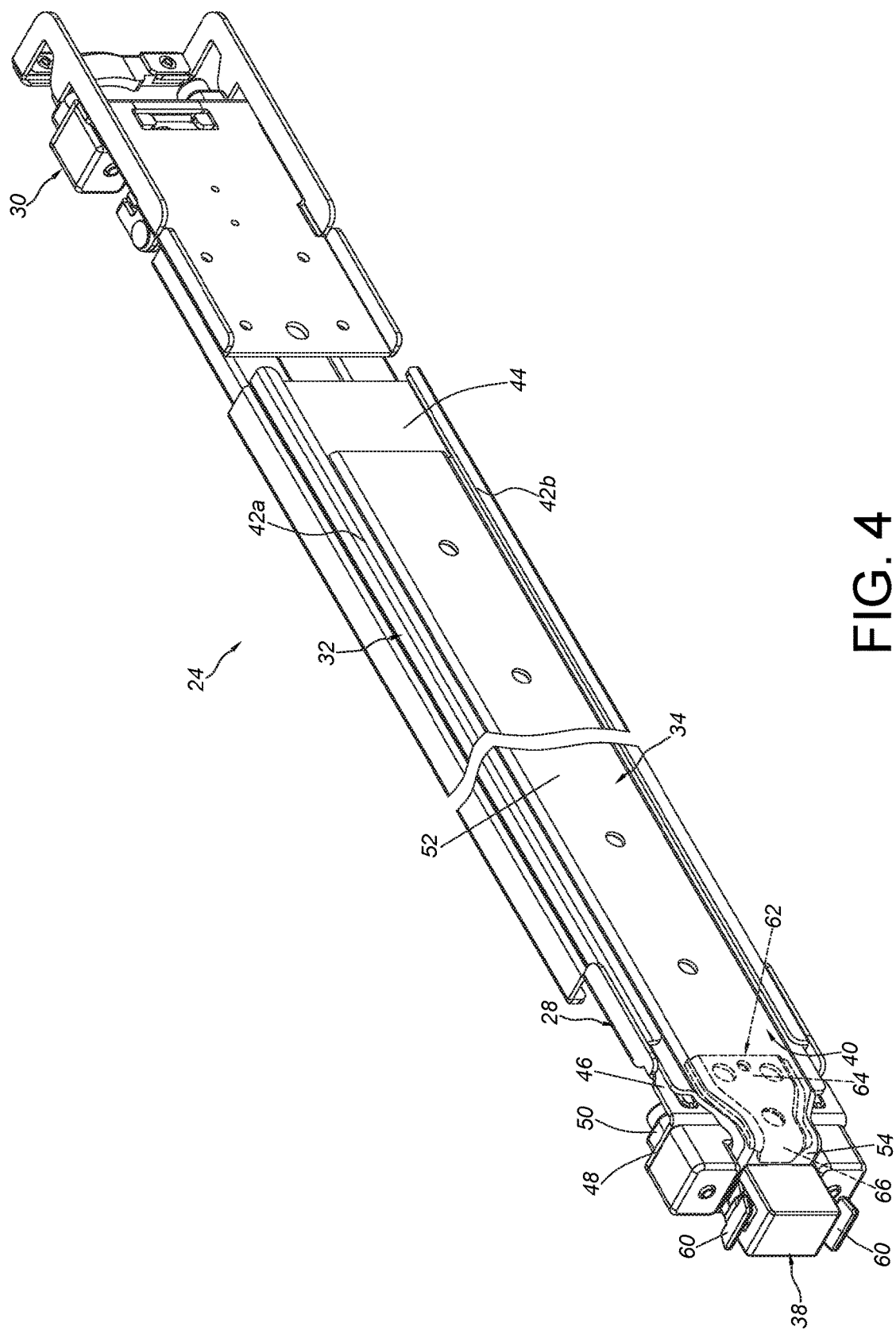

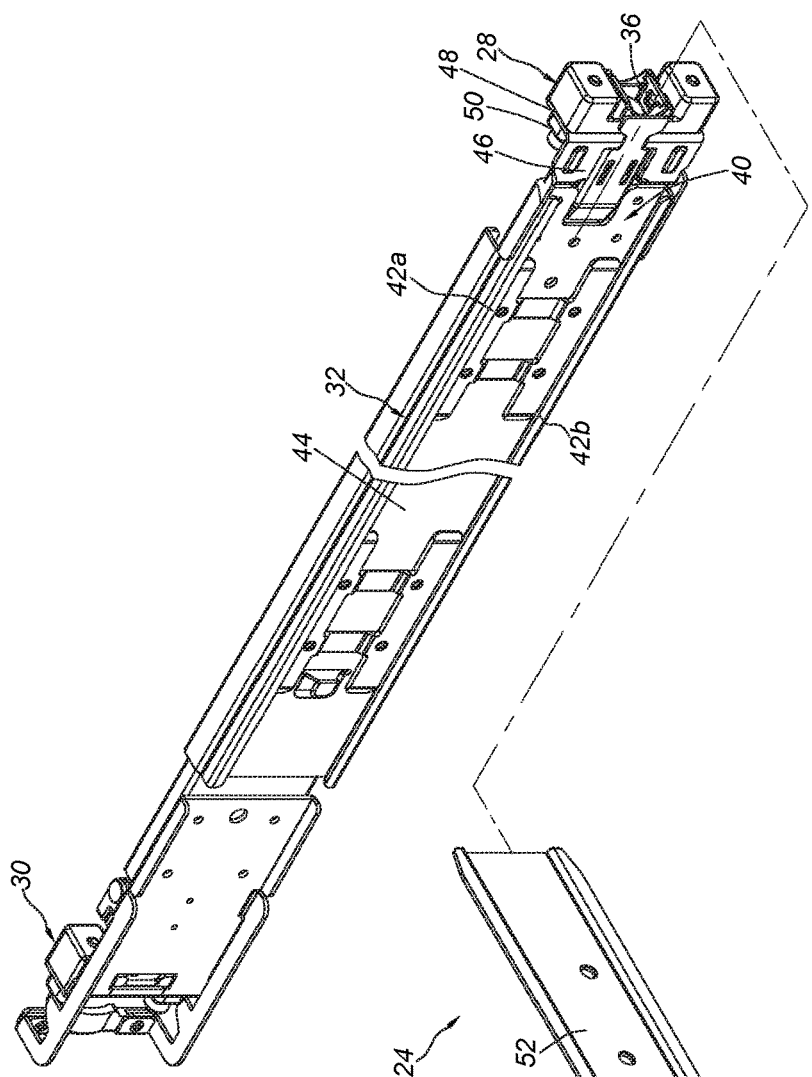
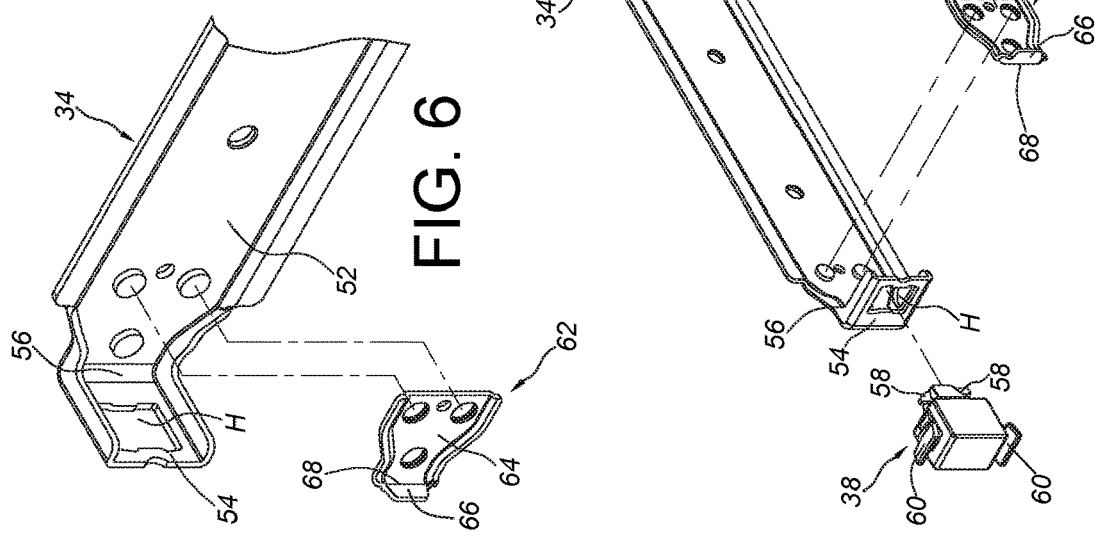
FIG. 5
FIG. 6

SLIDE RAIL ASSEMBLY AND SLIDE RAIL MECHANISM THEREOF

BACKGROUND OF THE INVENTION

1. Field of the Invention

The present invention relates to a slide rail, and more particularly, to a reinforced slide rail of a slide rail assembly or a slide rail mechanism.

2. Description of the Prior Art

U.S. Pat. No. 6,883,884 B2 discloses a latch assembly for a track device which mainly includes a first track member (11) and a second track member (12). The latch assembly comprises a latch handle (21) mounted to the first track member (11), and a latch seat (23) provided on the second track member (12). A latching portion (211) of the latching handle (21) is releasably engaged with the latch seat (23), such that the first track member (11) is locked and not movable relative to the second track member (12) when the first track member (11) is retracted, in order to fix a drawer (2) relative to a wall (1). Moreover, a user can disengage the latching handle (21) from the latch seat (23) if necessary.

In addition, U.S. Pat. No. 9,370,120 B2 discloses a slide assembly (12). The slide assembly comprises a bracket (28) and an engaging member (58). Wherein, the slide assembly is mounted to posts (13, 14) of a rack (10) through two brackets (28, 30). Wherein, the engaging member (58) has a fastening portion (64). When a chassis (74) is moved to a retracted position through the slide assembly, a hook portion (84) on the chassis (74) can be engaged with the fastening portion (64), so as to lock the chassis (74) at the retracted position. The aforementioned two cases are provided for reference.

However, for different mounting environments or shapes of carried objects, the slide rail must have a specific structure to meet the requirements. Therefore, the slide rail may not have sufficient strength to support an overweight carried object, such that the slide rail can be easily deformed due to unintentional collision, an external force or the weight of the carried object. Therefore, it is important to improve structural strength of the slide rail.

SUMMARY OF THE INVENTION

The present invention provides a slide rail assembly or a slide rail mechanism with a reinforced slide rail structure.

According to an embodiment of the present invention, a slide rail assembly comprises a first rail, a second rail and a reinforcing structure. The first rail has a passage. The second rail is movable relative to the first rail. The second rail comprises a first section and a second section. The second section is connected to the first section through a bending section and bent relative to the first section. Wherein, the first section is mounted into the passage, and the second section is located outside the passage. The reinforcing structure is arranged on the second rail. The reinforcing structure comprises a first part and a second part. The second part is connected to the first part through a bending part and bent relative to the first part. Wherein, the first part, the bending part and the second part are respectively attached to the first section, the bending section and the second section.

Preferably, the first part and the second part are attached to a portion of the first section and a portion of the second section respectively.

Preferably, the reinforcing structure is an additional component connected to the second rail.

Preferably, the first part, the bending part and the second part are integrally formed with the second rail and protruded from the second rail.

Preferably, the slide rail assembly further comprises an engaging mechanism and a bracket device. The engaging mechanism is arranged on the second section of the second rail. The engaging mechanism comprises an engaging member. The bracket device is arranged on the first rail. The bracket device comprises a side wall, an end wall and a mounting member. The end wall is bent relative to the side wall. The mounting member is arranged on the end wall. A mounting feature is arranged adjacent to the end wall and configured to be engaged with the engaging member.

Preferably, the engaging mechanism further comprises an operating member configured to be operated to disengage the engaging member from the mounting feature.

Preferably, the second rail has an inner side and an outer side. The reinforcing structure is attached to one of the inner side and the outer side of the second rail.

Preferably, the second section is substantially perpendicularly connected to the first section. The second part is substantially perpendicularly connected to the first part.

According to another embodiment of the present invention, a slide rail mechanism comprises a slide rail and a reinforcing structure. The slide rail comprises a first section and a second section. The second section is bent relative to the first section. The reinforcing structure is arranged on the slide rail. The reinforcing structure comprises a first part and a second part. Wherein, the first part and the second part are respectively attached to the first section and the second section.

According to another embodiment of the present invention, a slide rail mechanism comprises a slide rail and a reinforcing structure. The slide rail comprises a first section and a second section. The second section is bent relative to the first section. The reinforcing structure comprises a first part and a second part. Wherein, the first part and the second part are respectively attached to the first section and the second section, and the first part is fixed to the first section.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is a diagram showing the rack system of the present invention mounted with the carried object through the slide rail assembly located at an extension position;

FIG. 3 is an enlarged view of an area A of FIG. 2;

FIG. 4 is a diagram showing the slide rail assembly of the present invention;

FIG. 5 is an exploded view of the slide rail assembly of the present invention;

FIG. 6 is an exploded view of the slide rail assembly and a reinforcing structure according to a first embodiment of the present invention;

DETAILED DESCRIPTION

Figure 1:
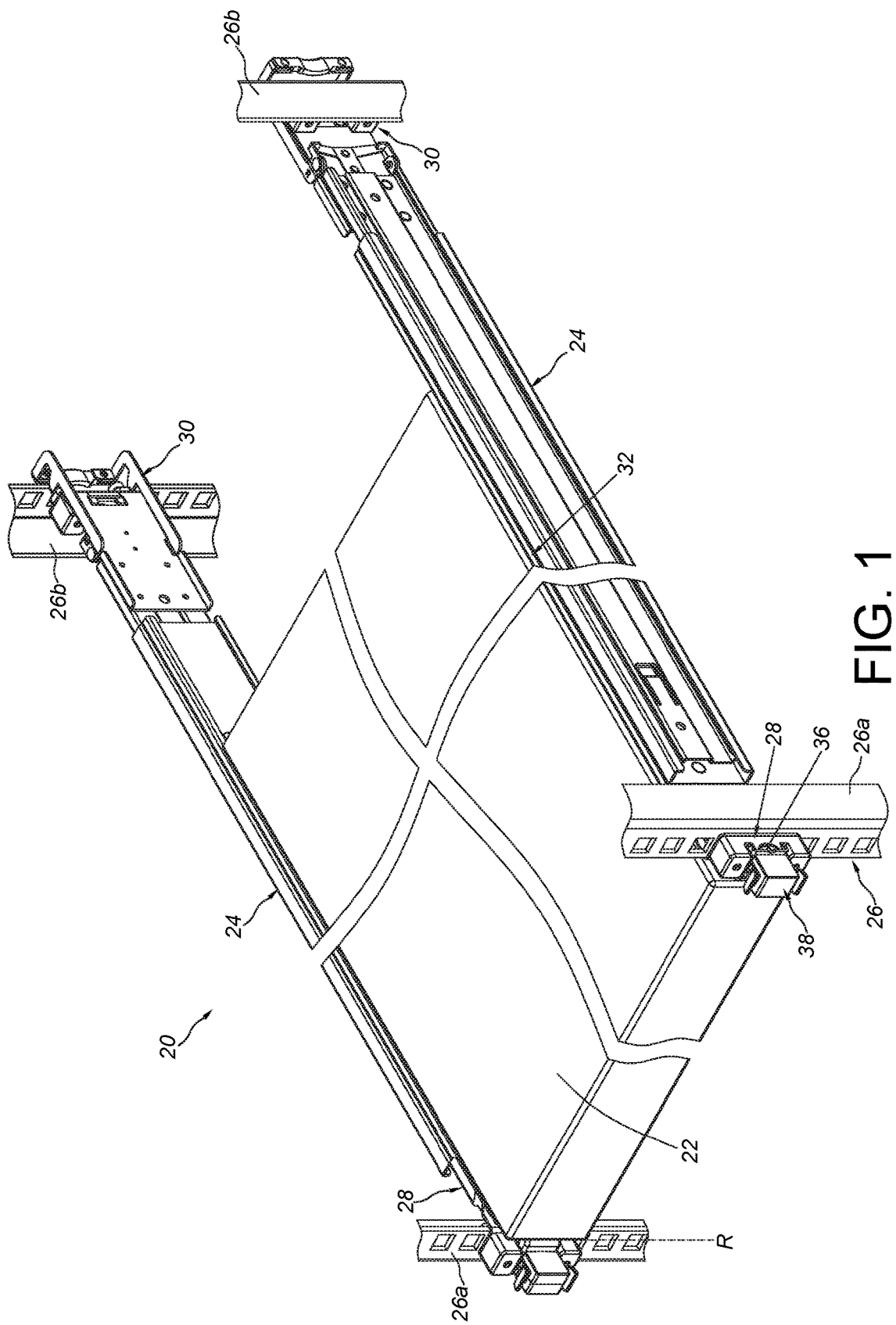
FIG. 1 is a diagram showing a rack system of the present invention mounted with a carried object through a slide rail assembly located at a retracted position.

As shown in FIG. 1 and FIG. 2, in a rack system 20, two sides of a carried object 22 can be mounted to a rack 26 through a pair of slide rail assemblies 24. Wherein, the carried object 22 can be an electronic device or a chassis. The rack 26 comprises a plurality of posts, such as a pair of first posts 26*a* and a pair of second posts 26*b*. Each of the slide rail assemblies 24 can be mounted to the rack 26 through a first bracket device 28 and a second bracket device 30.

The slide rail assembly 24 comprises a first rail 32 and a second rail 34. Wherein, an end of the first rail 32 (such as a front end) is arranged with the first bracket device 28. The other end of the first rail 32 (such as a rear end) is arranged with the second bracket device 30. The second bracket device 30 can be adjusted to move relative to the first rail 32. The first bracket device 28 and the second bracket device 30 are configured to mount the first rail 32 to the first posts 26*a* and the second posts 26*b* respectively. On the other hand, the second rail 34 is longitudinally movable relative to the first rail 32 and configured to mount the carried object 22, such that the carried object 22 can be moved with the second rail 34 from a retracted position R (as shown in FIG. 1) to an extension position E (as shown in FIG. 2) along a direction D, or can be moved back to the retracted position R from the extension position E.

Preferably, the first bracket device 28 comprises a mounting feature 36 (please also refer to FIG. 3), and the slide rail assembly 24 further comprises an engaging mechanism 38 arranged on the second rail 34. Wherein, when the second rail 34 is located at the retracted position R, the engaging mechanism 38 is engaged with the mounting feature 36, such that the second rail 34 and the carried object 22 can be held at the retracted position R. Or, when the engaging mechanism 33 is disengaged from the mounting feature 36, the second rail 34 can be moved away from the retracted position R.

As shown in FIG. 4, the first rail 32 has a passage 40. Specifically, the first rail 32 comprises a first wall 42*a*, a second wall 42*b* and a longitudinal wail 44 connected between the first wall 42*a* and the second wall 42*b*. The passage 40 is defined by the first wall 42*a*, the second wall 42*b* and the longitudinal wall 44. Preferably, the first bracket device 28 is arranged at the front end of the first rail 32, and comprises a side wail 46, an end wall 48 and at least one mounting member 50 (FIG. 4 only shows one mounting member 50 due to the viewing angle). The side wail 46 is connected to the first rail 32. The end wall 48 is bent relative to the side wall 46. The at least one mounting member 50 is arranged on the end wall 48. Wherein, the mounting feature 36 is in front of the end wall 48 (please also refer to FIG. 5).

As shown in FIG. 4 and FIG. 5, the second rail 34 comprises a first section 52 and a second section 54. The second section 54 is bent relative to the first section 52. In the present embodiment, the second section 54 is connected to the first section 52 through a bending section 56 (please also refer to FIG. 6) and bent relative to the first section 52. The second section 54 is substantially perpendicularly connected to the first section 52. The first section 52 is mounted into the passage 40 of the first rail 32, and the second section 54 is located outside the passage 40.

Preferably, the engaging mechanism 38 is arranged on the second section 54 of the second rail 34. The engaging mechanism 38 comprises an engaging member 58 and an operating member 60. The engaging member 58 is configured to be engaged with the mounting feature 36 (such as an inner wall of a hole) of the first bracket device 28. The operating member 60 is configured to be operated to drive the engaging member 58 to move, in order to disengage the engaging member 58 from the mounting feature 36. For example, when the engaging member 58 is engaged with the mounting feature 36, a user can press the operating member 60 to drive the elastically-loaded engaging member 58, in order to disengage the engaging member 58 from the mounting feature 36. Preferably, the second section 54 has an opening H, such that the engaging member 58 of the engaging mechanism 38 can pass through the opening H to be engaged with the mounting feature 36.

Furthermore, the slide rail assembly 24 further comprises a reinforcing structure 62 arranged on the second rail 34. The reinforcing structure 62 comprises a first part 64 and a second part 66. The second part 66 is bent relative to the first part 64. In the present embodiment, the second part 66 is connected to the first part 64 through a bending part 68 and bent relative to the first part 64. The second part 66 is substantially perpendicularly connected to the first part 64. The first part 64, the bending part 68 and the second part 66 are respectively attached to the first section 52, the bending section 56 and the second section 54 (please also refer to FIG. 6).

Figure 7:
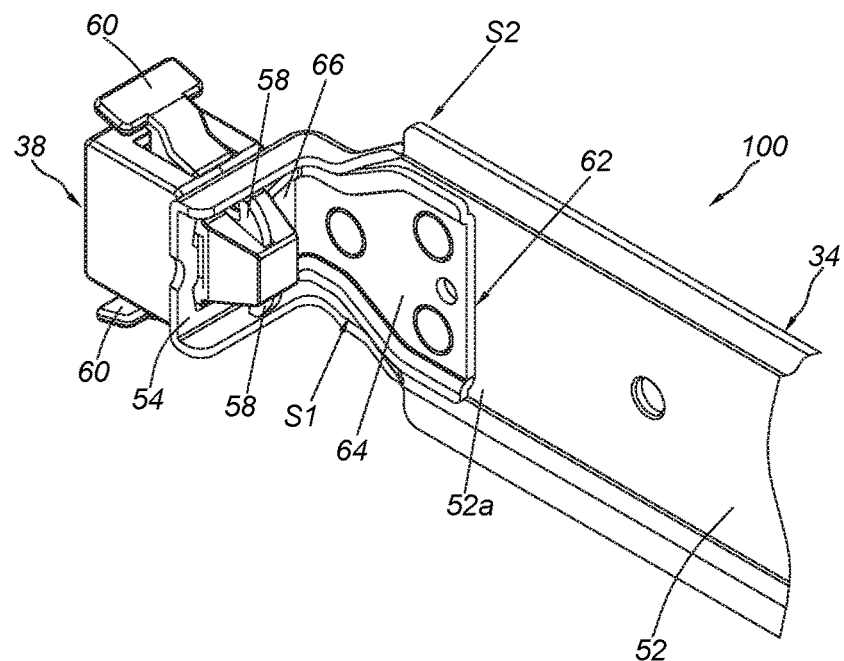
FIG. 7 is a partial view of a slide rail mechanism according to the first embodiment of the present invention.
Figure 8:
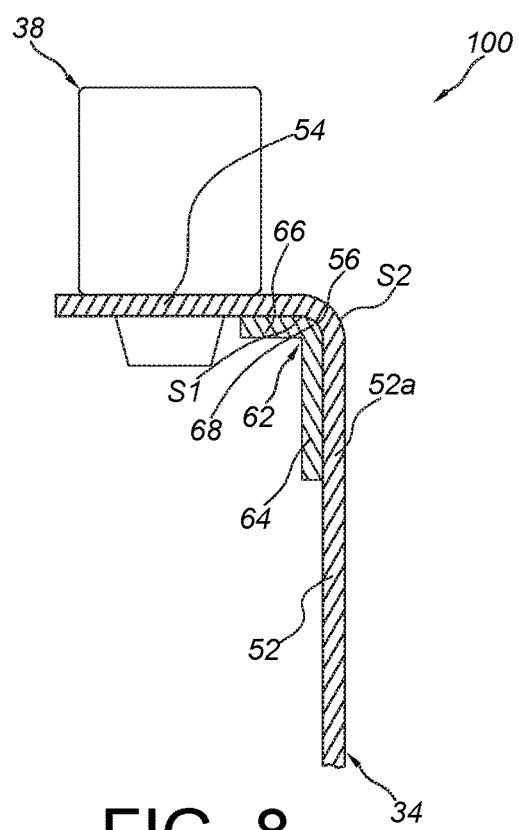
FIG. 8 is a diagram showing the slide rail mechanism according to the first embodiment of the present invention.

As shown in FIG. 7 and FIG. 8, the second rail 34 and the reinforcing structure 62 can be seen as a slide rail mechanism 100. Furthermore, in the first embodiment, the reinforcing structure 62 is located adjacent to a front part 52*a* of the first section 52 of the second rail 34. The reinforcing structure 62 is configured to improve structure strength of the first section 52, the bending section 56 and the second section 54 of the second rail 34.

The reinforcing structure 62 is fixedly arranged at one of an inner side S1 and an outer side S2 of the second rail 34. In the present embodiment, the reinforcing structure 62 is arranged at the inner side S1 of the second rail 34. The first part 64 and the second part 66 of the reinforcing structure 62 are respectively attached to the first section 52 and the second section 54 of the second rail 34 partially. For example, the first part 64 is only attached to a portion of the first section 52, and the second part 66 is only attached to a portion of the second section 54. In addition, the bending part 68 of the reinforcing structure 62 is attached to the bending section 56 of the second rail 34. In the present embodiment, the reinforcing structure 62 is an additional component connected to the second rail 34.

Figure 9:
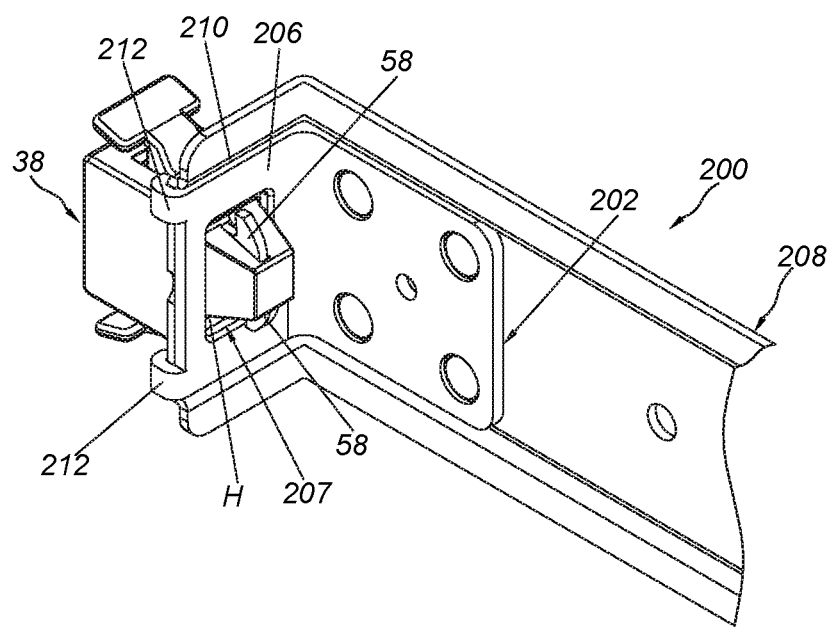
FIG. 9 is a partial view of a slide rail mechanism according to a second embodiment of the present invention.

FIG. 9 is a diagram showing a slide rail mechanism 200 according to a second embodiment of the present invention. Different from the slide rail mechanism 100 of the first embodiment, a second part 206 of a reinforcing structure 202 of the slide rail mechanism 200 has an opening 207 communicated with an opening H of a second section 210 of a second rail 208, such that the engaging member 58 of the engaging mechanism 38 can pass through the openings H, 207 to be engaged with the mounting feature 36. In addition, the second part 206 of the reinforcing structure 202 comprises at least one connecting feature 212 connected to the second rail 208. The at least one connecting feature 212, such as a pair of hooks, is configured to hook or hold the second section 210 of the second rail 208, so as to improve structural strength and stability of connection between the reinforcing structure 202 and the second section 210 of the second rail 208.

Figure 10:
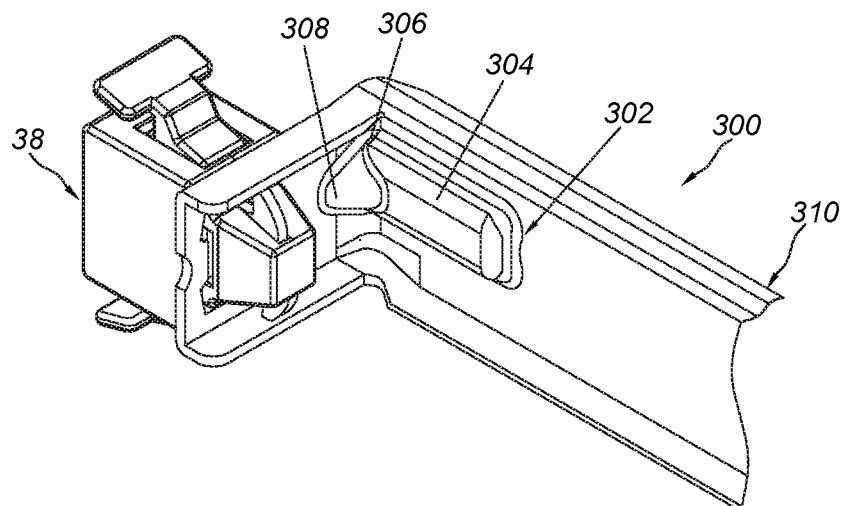
FIG. 10 is a partial view of a slide rail mechanism according to a third embodiment of the present invention.
Figure 11:
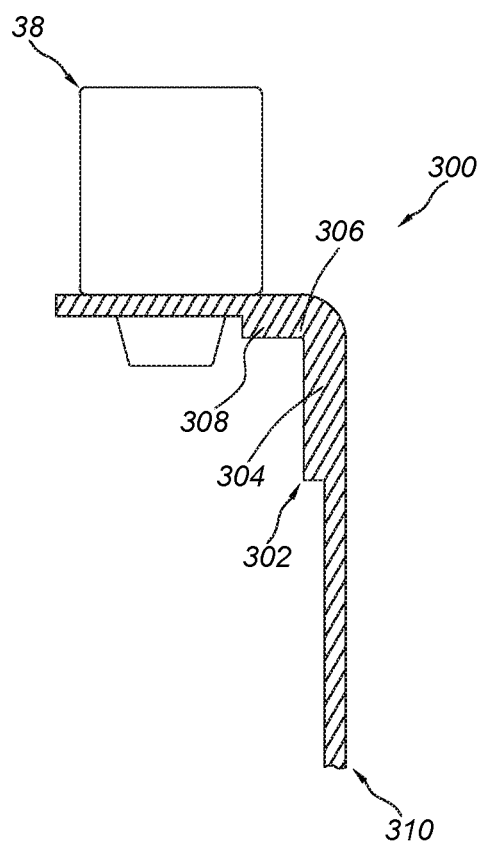
FIG. 11 is a diagram showing the slide rail mechanism according to the third embodiment of the present invention.

FIG. 10 and FIG. 11 are diagrams showing a slide rail mechanism 300 according to a third embodiment of the present invention. Different from the slide rail mechanism 100 of the first embodiment, a first part 304, a bending part 306 and a second part 308 of a reinforcing structure 302 of the slide rail mechanism 300 are integrally formed with the second rail 310 and protruded from the second rail 310 as ribs or protrusions. As such, the slide rail mechanism 300 can also improve structural strength of the second rail 310.

Therefore, the slide rail assembly and the slide rail mechanism of the present invention are characterized in that:
1. The second rail comprises the first section and the second section, and the second section is bent relative to the first section. The reinforcing structure is arranged on the second rail. The reinforcing structure comprises the first part and the second part. The second part is bent relative to the first part. Wherein, the first part and the second part are respectively attached to the first section and the second section, in order to improve the structural strength of the first section and the second section of the second rail.
2. The second part of the reinforcing structure comprises at least one connecting feature configured to hook or hold the second section of the second rail, so as to improve structural strength and stability of connection between the reinforcing structure and the second section of the second rail.
3. One of the first rail and the second rail is arranged with the engaging mechanism, and the other one of the first rail and the second rail is arranged with the bracket device. Wherein, the bracket device has the mounting feature configured to be engaged with the engaging member, so as to hold the second rail at the retracted position relative to the first rail.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail having a passage;
a second rail movable relative to the first rail, the second rail comprising a first section and a second section, the second section being connected to the first section through a bending section and bent relative to the first section, wherein the first section is mounted into the passage, and the second section is located outside the passage; and
a reinforcing structure arranged on the second rail, the reinforcing structure comprising a first part and a second part, the second part being connected to the first part through a bending part and bent relative to the first part;
wherein the first part, the bending part and the second part are respectively attached to the first section, the bending section and the second section;
wherein the reinforcing structure is an additional component connected to the second rail, the second part of the reinforcing structure comprises an opening aligned and communicated with an opening of the second section of the second rail, and the second part of the reinforcing structure further comprises at least one connecting feature configured to fix the second part of the reinforcing structure onto the second section of the second rail.

2. The slide rail assembly of claim 1, wherein the first part and the second part are attached to a portion of the first section and a portion of the second section respectively.

3. The slide rail assembly of claim 1, further comprising an engaging mechanism and a bracket device, wherein the engaging mechanism is arranged on the second section of the second rail, the engaging mechanism comprises an engaging member, the bracket device is arranged on the first rail, the bracket device comprises a side wall, an end wall and a mounting member, the end wall is bent relative to the side wall, the mounting member is arranged on the end wall, a mounting feature is arranged adjacent to the end wall and configured to be engaged with the engaging member, the engaging member of the engaging mechanism is configured to pass through the opening of the second section of the second rail and the opening of the reinforcing structure to be engaged with the mounting feature.

4. The slide rail assembly of claim 3, wherein the engaging mechanism further comprises an operating member configured to be operated to disengage the engaging member from the mounting feature.

5. The slide rail assembly of claim 1, wherein the second rail has an inner side and an outer side, and the reinforcing structure is attached to one of the inner side and the outer side of the second rail.

6. The slide rail assembly of claim 1, wherein the second section is substantially perpendicularly connected to the first section, and the second part is substantially perpendicularly connected to the first part.

7. A slide rail mechanism, comprising:
a slide rail comprising a first section and a second section, the second section being bent relative to the first section; and
a reinforcing structure arranged on the slide rail, the reinforcing structure comprising a first part and a second part;
wherein the first part and the second part are respectively attached to the first section and the second section;
wherein the reinforcing structure is an additional component connected to the slide rail, the second part of the reinforcing structure comprises an opening aligned and communicated with an opening of the second section of the slide rail, and the second part of the reinforcing structure further comprises at least one connecting feature configured to fix the second part of the reinforcing structure onto the second section of the slide rail.

8. The slide rail mechanism of claim 7, wherein the second section is substantially perpendicularly connected to the first section, and the second part is substantially perpendicularly connected to the first part.

9. The slide rail mechanism of claim 7, wherein the first part and the second part are attached to a portion of the first section and a portion of the second section respectively.

10. The slide rail mechanism of claim 7, wherein the at least one connecting feature is a hook.

11. The slide rail mechanism of claim 7, wherein the slide rail has an inner side and an outer side, and the reinforcing structure is attached to one of the inner side and the outer side of the slide rail.

12. A slide rail mechanism, comprising:
a slide rail comprising a first section and a second section, the second section being bent relative to the first section; and a reinforcing structure comprising a first part and a second part;

wherein the first part and the second part are respectively attached to the first section and the second section, and the first part is fixed to the first section;

wherein the reinforcing structure is an additional component connected to the slide rail, the second part of the reinforcing structure comprises an opening aligned and communicated with an opening of the second section of the slide rail, and the second part of the reinforcing structure further comprises at least one connecting feature configured to fix the second part of the reinforcing structure onto the second section of the slide rail.

13. The slide rail mechanism of claim 12, wherein the slide rail has an inner side and an outer side, and the reinforcing structure is attached to one of the inner side and the outer side of the slide rail.

14. The slide rail mechanism of claim 12, wherein the second section is substantially perpendicularly connected to the first section, and the second part is substantially perpendicularly connected to the first part.

15. The slide rail mechanism of claim 12, wherein the at least one connecting feature is a hook.

* * * * *